United States Patent [19]

Cheng

[11] Patent Number: 5,315,187

[45] Date of Patent: May 24, 1994

[54] SELF-CONTROLLED OUTPUT STAGE WITH LOW POWER BOUNCING

[75] Inventor: Chia-Lin Cheng, Taoyuan, Taiwan

[73] Assignee: Acer Incorporated, Taipei, Taiwan

[21] Appl. No.: 925,507

[22] Filed: Aug. 5, 1992

[51] Int. Cl.$^5$ .................. H03B 1/04; H03K 17/16
[52] U.S. Cl. .................. 307/542.1; 307/572; 307/443
[58] Field of Search ............... 307/443, 542.1, 571, 307/572, 576

[56] References Cited

U.S. PATENT DOCUMENTS

| | | | |
|---|---|---|---|
| 4,329,600 | 5/1982 | Stewart | 307/270 |
| 4,567,378 | 1/1986 | Raver | 307/270 |
| 4,612,466 | 9/1986 | Stewart | 307/270 |
| 4,862,018 | 8/1989 | Taylor et al. | 307/572 |
| 4,961,010 | 10/1990 | Davis | 307/572 |
| 5,111,076 | 5/1992 | Tarng | 307/443 |
| 5,138,194 | 8/1992 | Yoeli | 307/542.1 |

Primary Examiner—E. Rollins Cross
Assistant Examiner—Thomas Morris
Attorney, Agent, or Firm—Townsend and Townsend Khourie and Crew

[57] ABSTRACT

An output stage that reduces power or ground bouncing caused by a capacitive load while either a single or multiple outputs are switching at the same time. A first control means coupled to a power source generates first control signal to the gate terminal of a first MOS transistor in response to an input signal. A second control means coupled to ground generates a second control signal to the gate terminal of the second MOS transistor in response to the input signal. A first gate control means generates third and fourth control signals to the gate terminals of the first and second MOS transistor respectively, in response to the input signal, to turn on one of the first and second MOS transistors partially. A second gate control means generates fifth and sixth control signals to the gate terminals of the first and second MOS transistor respectively, in response to the input signal and the output signal, to turn on said one of the first and second MOS transistors entirely.

14 Claims, 5 Drawing Sheets

SELF-CONTROLLED OUTPUT STAGE WITH LOW POWER BOUNCING

BACKGROUND OF THE INVENTION

1. Field of the Invention

The present invention relates generally to an output stage having low power-bouncing characteristics for use in electronic devices, and more particularly, to such low power or ground bouncing characteristics due to current discharge from a capacitive load when the output is switching.

2. Description of Related Art

A ground bouncing phenomenon is a voltage ground Vss fluctuation induced by switching of the outputs of an electronic device. The bouncing is exacerbated by having multiple outputs with simultaneous switching and may cause malfunction of circuits having Vss' as a reference ground. FIG. 1 depicts a typical device circuit with only one detailed output stage shown coupled to a capacitive load. A typical electronic device, such as an integrated circuit (IC) device, comprises 8, 16, 32 or even 64 output stages. As shown in FIG. 1, the output signal A of circuit 11 is input to the gate terminals of MOS transistors M1 and M2. The source terminal of MOS transistor M1 is coupled to the power supply Vdd through an inductance L3 and the source terminal of MOS transistor M2 is coupled to the ground voltage through an inductance L2. The inductance L2 is associated with the inductance inherently existing on the wiring between the source terminal of M2 and an output pin of the IC package. The output Y is taken at the connection of the drain terminal of M1 and the drain terminal of M2. A capacitance C1 is associated with the load to which the output is coupled and the inductance L1 is a wiring inductance. A voltage Vss' is taken at the source terminal of the transistor M2 to be utilized as a ground reference for the circuit 11. For example, the internal flip-flops of the circuit 11 may need a reliable and predictable ground reference Vss' for accurate operation. When output signal Y is not switching, or not changing state, no current is flowing through the inductance L2 and the voltage of Vss' is equal to the GND. However, as the output signal Y is switching from high to low in response to the stage change of signal A, a current I is quickly discharging from the capacitive load C1 through inductance L1, MOS transistor M2 and inductance L2 to GND. The instantaneous value of the current I is equal to C1*dV/dt. The instantaneous value of the Vss induced is, therefore, equal to L2*dI/dt. The voltage induced on the source terminal of transistor M2 results in a ground voltage bouncing of Vss', and is known as a ground bouncing phenomenon in the art. The voltage induced on Vss' will be substantial when multiple outputs are switching at the same time. For instance, as sixteen outputs switch from high to low voltage at the same time, the voltage change of Vss' is equal to 16*L2*dI/dt. A significant fluctuation of Vss' beyond a tolerance limit may cause malfunction of any circuits having Vss' as a reference ground.

By a similar mechanism, a power (Vdd') bouncing phenomenon also exists when the output signals are switching.

The power or ground bouncing phenomenon described above is best illustrated by the wave form of the FIG. 3. As the wave forms of the Vdd' and Vss' show, not only is the deviation from the reference voltage severe, but the time required to reach a steady state is long.

Recent relevant art is disclosed in the U.S. patent Application 07/821,965 which was filed on Jan. 16, 1992.

SUMMARY OF THE INVENTION

Accordingly, the present invention provides an output stage that reduces power or ground bouncing caused by a capacitive load. In particular, the present invention reduces power or ground bouncing while either a single or multiple outputs are switching at the same time.

The output stage circuit of the invention preferably comprises: a first control circuit for generating a first control signal to the gate terminal of the first MOS transistor in response to an input signal, the first control circuit being coupled to the Vdd; a second control circuit for generating a second control signal to the gate terminal of the second MOS transistor in response to the input signal, the second control circuit being coupled to the GND; a first gate control circuit for generating third and fourth control signals to the gate terminal of the first and second MOS transistors respectively, in response to the input signal, to turn on one of the first and second MOS transistors partially; and a second gate control circuit for generating fifth and sixth control signals to the gate terminal of the first and second MOS transistor respectively, in response to the input signal and the output signal, to turn on said one of the first and second MOS transistors entirely.

A further understanding of the nature and advantage of the present invention may be realized by reference to the Detailed Description of the Invention and the attached drawings.

DETAILED DESCRIPTION OF THE INVENTION

Figure 1:
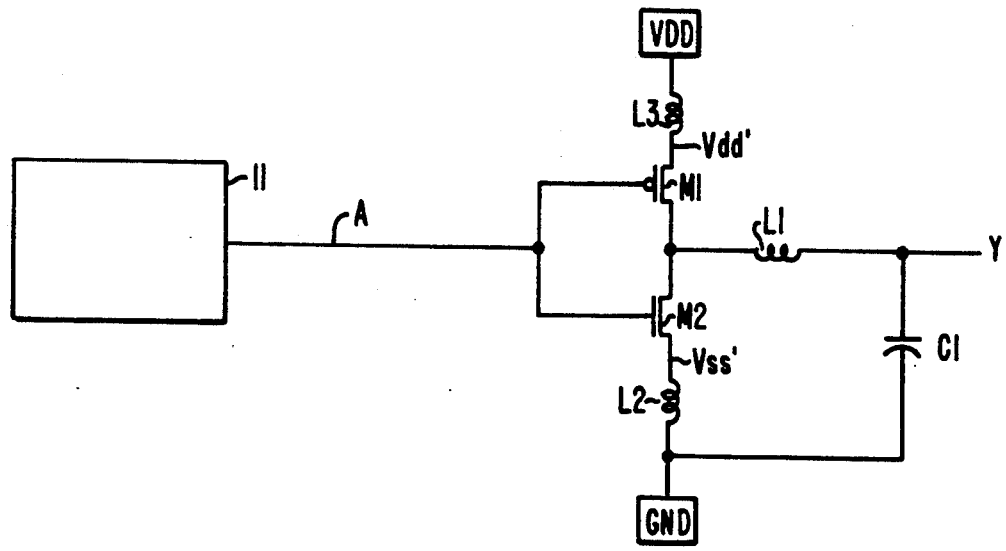
FIG. 1 shows an electronic device with an output stage coupled to a capacitive load in accordance with conventional art.
Figure 2:
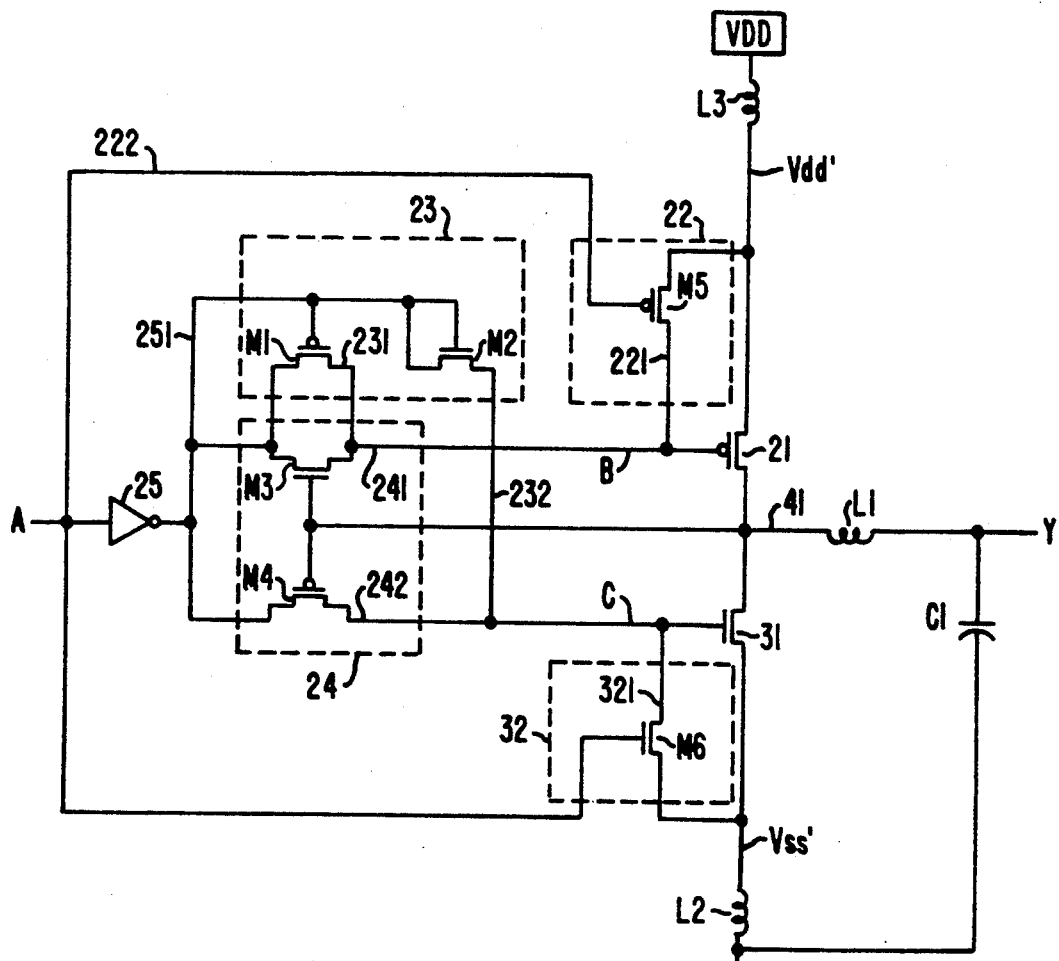
FIG. 2 shows a first preferred embodiment of the invention.

As shown in FIG. 2, in a first preferred embodiment the output stage of an electric device has a first MOS transistor 21 and a second MOS transistor 31 connected in cascade. The source terminal of the first MOS transistor 21 is coupled to Vdd. The drain terminal of the second MOS transistor 31 is coupled to the drain terminal of the first MOS transistor 31 to form an output terminal to generate an output signal 41. The source terminal of the second MOS transistor 31 is coupled to ground (GND). The reference power source is taken from Vdd' and the reference ground is taken from Vss' for use in the operation of other parts of an Integrated Circuit. In the preferred embodiment the first MOS transistor 21 and second MOS transistor 31 are PMOS and NMOS transistors respectively.

A first control circuit 22 generates a first control signal 221 to the gate terminal of the first MOS transistor 21 in response to an input signal 222. The first control circuit 22 is coupled to Vdd through a wire inductance L3. A second control circuit 32 generates a second control signal 321 to the gate terminal of the second MOS transistor 31 in response to the input signal 222. The second control circuit 32 is coupled to the ground through an inductance L2. A first gate control circuit 23 generates third and fourth control signals 231 and 232 to the gate terminal of the first and second MOS transistors 21 and 31, respectively, in response to an inversion signal 25 obtained by feeding input signal 222 through an inverter 25, to turn on one of the transistors 21, 31 partially. A second gate control circuit 24 generates firth 242 and sixth 242 control signals 241 and 242 to the gate terminal of the first and second MOS transistors 21 and 31 respectively, in response to the inversion signal 251 of input signal 222 and the output signal 41, to turn on said one of the transistors 21, 31 entirely. The ground or power bouncing phenomenon, observed in most conventional art, is reduced when the output signal 41 of the invention is changing state.

The first control circuit 22 comprises a PMOS transistor M5. The PMOS transistor M5 has a gate terminal coupled to the input signal 222, a source terminal coupled to Vdd through an wire inductance L3 and a drain terminal for outputing the first control signal 221.

The second control circuit 32 comprises an NMOS transistor M6. The NMOS transistor M6 has a gate terminal coupled to the input signal 222, a source terminal coupled to the Ground through a wire inductance L2 and a drain terminal for outputing the second control signal 321.

The first gate control circuit 23 comprises a PMOS transistor M1 and an NMOS transistor M2. The PMOS transistor M1 has a gate terminal coupled to the inversion signal 251 and an output terminal for outputing the third control signal 231. The NMOS transistor M2 has agate terminal coupled to the inversion signal 251 and an output terminal for outputing the fourth control signal 232.

The second gate control circuit 24 comprises a NMOS transistor M3 and a PMOS transistor M4. The NMOS transistor M3 has an inversion terminal coupled to the input signal 251 a gate terminal coupled to the output signal 41 and an output terminal for outputing the fifth control signal 241. The PMOS transistor M4 has an inversion terminal coupled to the input signal 251 a gate terminal coupled to the output signal 41 and an output terminal for outputing the sixth control signal 242.

When the input signal 222 is logic 1, the signals B and C are logic 0. The transistor 21 is therefore on and transistor 31 is off which results an output signal 41 of logic 1.

When the input signal 222 is logic 0, the signal B and C are logic 1. The transistor 21 is therefore off and transistor 31 is on which results an output signal 41 with logic 0.

The operation of the invention is described below as the input signal 222 changes from logic 1 to logic 0, and then back to logic 1.

At the outset of the change of input signal 222 from logic 1 to logic 0, transistor M5 is on to turn off transistor 21 and transistor M6 is off. Therefore, transistor 31 is ready to be turned on to output signal. Signal 251 changes state from 0 to logic 1 as the signal 222 changes state from logic 1 to logic 0. Since the drain and gate terminals of the transistor M2 are coupled to each other and equal to Vdd', the transistor M2 is initially on, current flows from drain to source until the signal 232 is equal to Vdd'−Vtn, where Vtn is the threshold voltage of the NMOS transistor with a positive value. The transistor M2 is off as the signal 232 reaches Vdd'−Tvn. The voltage difference between the gate and source of the transistor 31 is Vdd'-Vtn, which is greater than Vtn, which turns on the transistor 31. However, the voltage difference between the gate and source of transistor 31 is Vdd'-Vtn instead of being Vdd', so the conducting current of transistor 31 is smaller than that when Vdd' is applied to the gate of transistor 31. Transistor 31 is selected so that when Vdd' applied to its gate, it is turned on entirely in this invention. As the gate of transistor 31 receives a voltage greater than Vtn but less than Vdd', it is turned on partially, so that transistor 31 is turned on partially at a first stage. Transistor 31 is therefore conducting and current flows into the GND. As a result, the output signal 41 commences to drop. During this time, the gate terminal of transistor 31 is controlled by transistor M2 and transistor M4 is off. At a later point in time, transistor M4 is forced to open due to the falling of the output signal 41. At this moment, current flows from the source to drain of the transistor M4 and the voltage of signal C becomes Vdd' so that transistor 31 is turned on entirely at a second stage. At the end of this process, the output signal 41 turns logic 0. The signals B and C are logic 1 with a voltage value of Vdd'.

At the outset of a change of input signal 222 from logic 0 to logic 1, transistor M6 is on to turn off transistor 31 and transistor M5 is off. Therefore, transistor 21 is ready to be turned on to output a signal. The signal 251 changes state from 1 to logic 0 as the signal 222 changes state from logic 0 to logic 1. Since the drain and gate terminals of the transistor M1 are coupled to each other and equal to Vss', transistor M1 is initially on, current flows from source to drain until the signal 231 is equal to Vss'−Vtp, where Vtp is the threshold voltage of the PMOS transistor with a negative value. The voltage difference between the gate and source of the transistor 21 is Vss'−Vtp−Vdd', which is smaller than Vtp, which turns on transistor 21. However, the voltage difference between the gate and source of transistor 21 is Vss'−Vtp−Vdd' instead of being Vss'−Vdd', so that conducting current of transistor 21 is smaller than that when Vss' is applied to the gate. When Vss' is applied to the gate of the transistor 21, it is turned on entirely in this invention. As a voltage greater than zero and less than Vdd'+Vtp is applied to the gate of transistor 21, it is turned on partially, so that transistor 21 is turned on partially at a first stage. The transistor 21 is therefore conducting and current flows from Vdd'. As a result, the output signal 41 commences to rise. During this time, the gate terminal of transistor 21 is controlled by transistor M1 and transistor M3 is off. At a later point in time, the transistor M3 is forced to open due to the rising of the output signal 41. At this moment, current flows from the drain to source of the transistor M3 and the voltage of signal B becomes zero at the end. Therefore transistor 21 is turned on entirely at a second stage. At the end of this process, the output signal 41 turns logic 1. The signals B and C are in logic 0 with a voltage value of Vss'.

Figure 4:
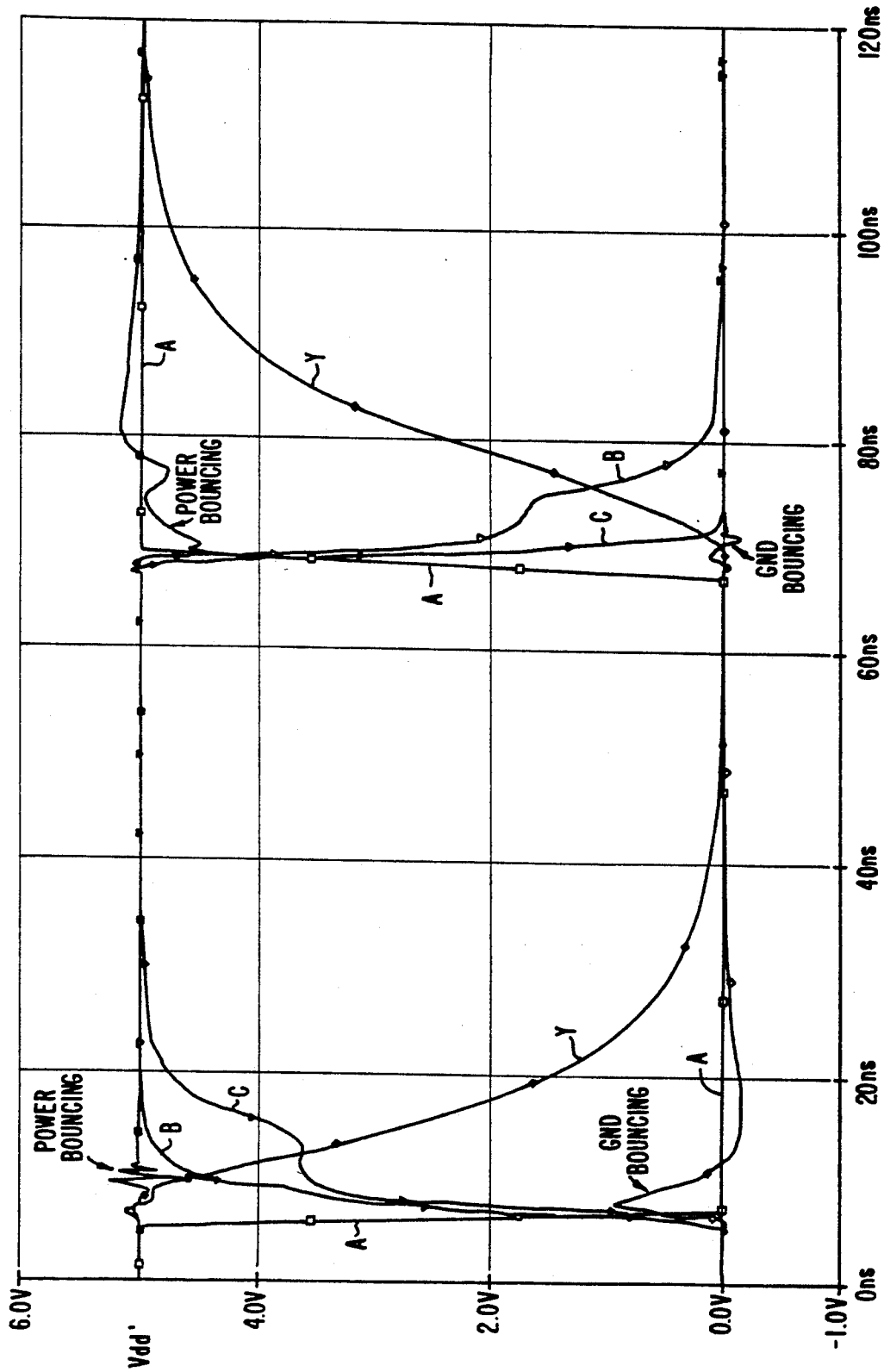
FIG. 4 is a timing diagram of related signals for the circuit of FIG. 2.

The wave form of the related signals in FIG. 2 recited above is shown in the FIG. 4.

As shown in the FIG. 4, the input signal 222 is initially logic 1. The input signal 222 changes from logic 1 to logic 0, then changes back to logic 1. It is very obvious that the power or ground bouncing phenomenon is substantially reduced as a result of the present invention. It may be seen from the shape of signal C that there are two stages involved when transistor 31 is forced to turn on; that is, partial-on and entire-on states of transistor 31. Also, from the shape of signal B, there are two stages involved when the transistor 21 is forced to turn on, that is, partial-on and entire-on state of the transistor 21.

Figure 3:
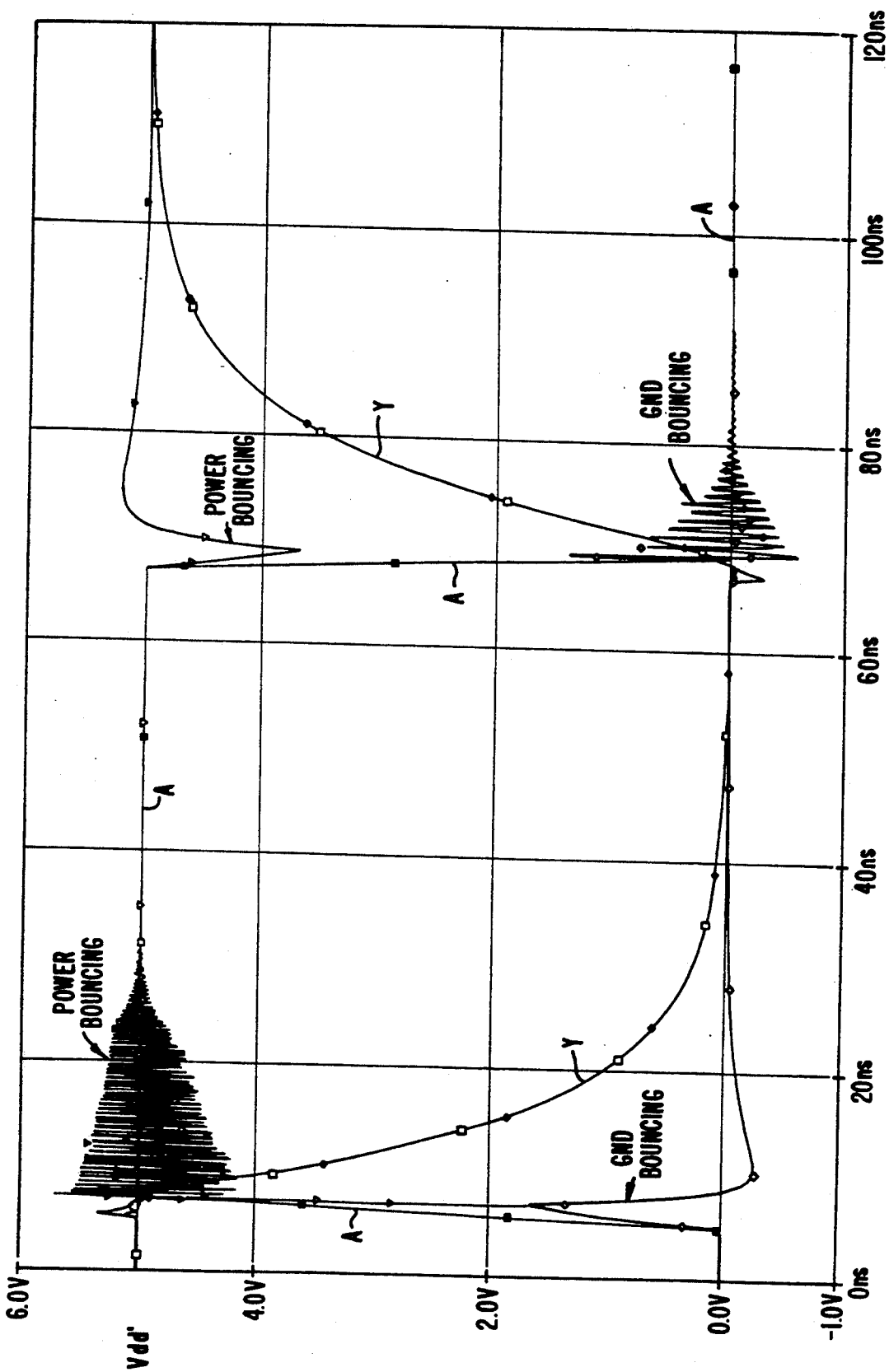
FIG. 3 is a timing diagram of related signals for the circuit of FIG. 1.
Figure 5:
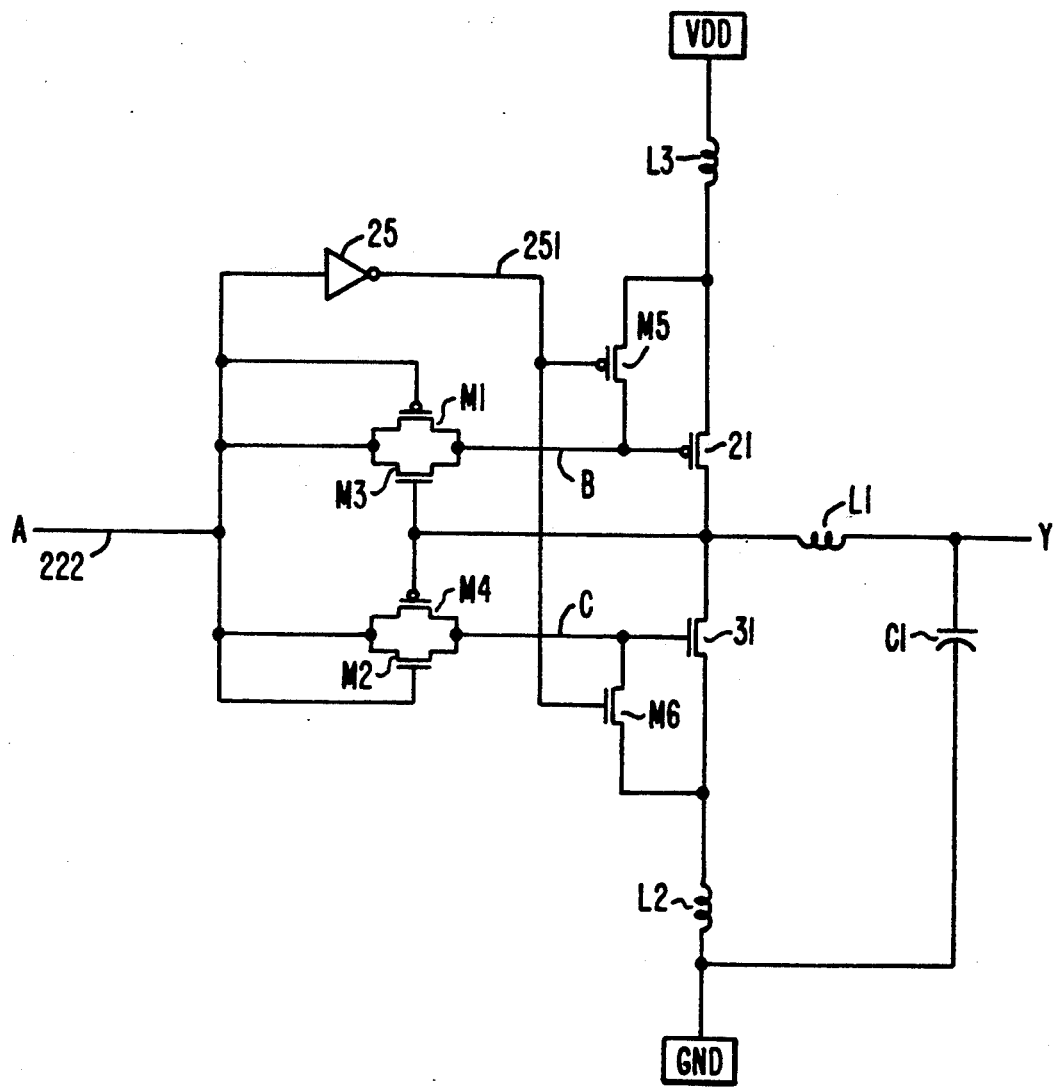
FIG. 5 shows a second preferred embodiment of the invention.

FIG. 5 shows another embodiment of the invention. As may be seen from the FIG. 5, it is very similar to that shown in the FIG. 2 except the output is an inverse of the input signal. As the combination of elements and the operation thereof of the FIG. 5 is similar to the above detailed descriptions of FIG. 3, further recitation is unnecessary.

Figure 6:
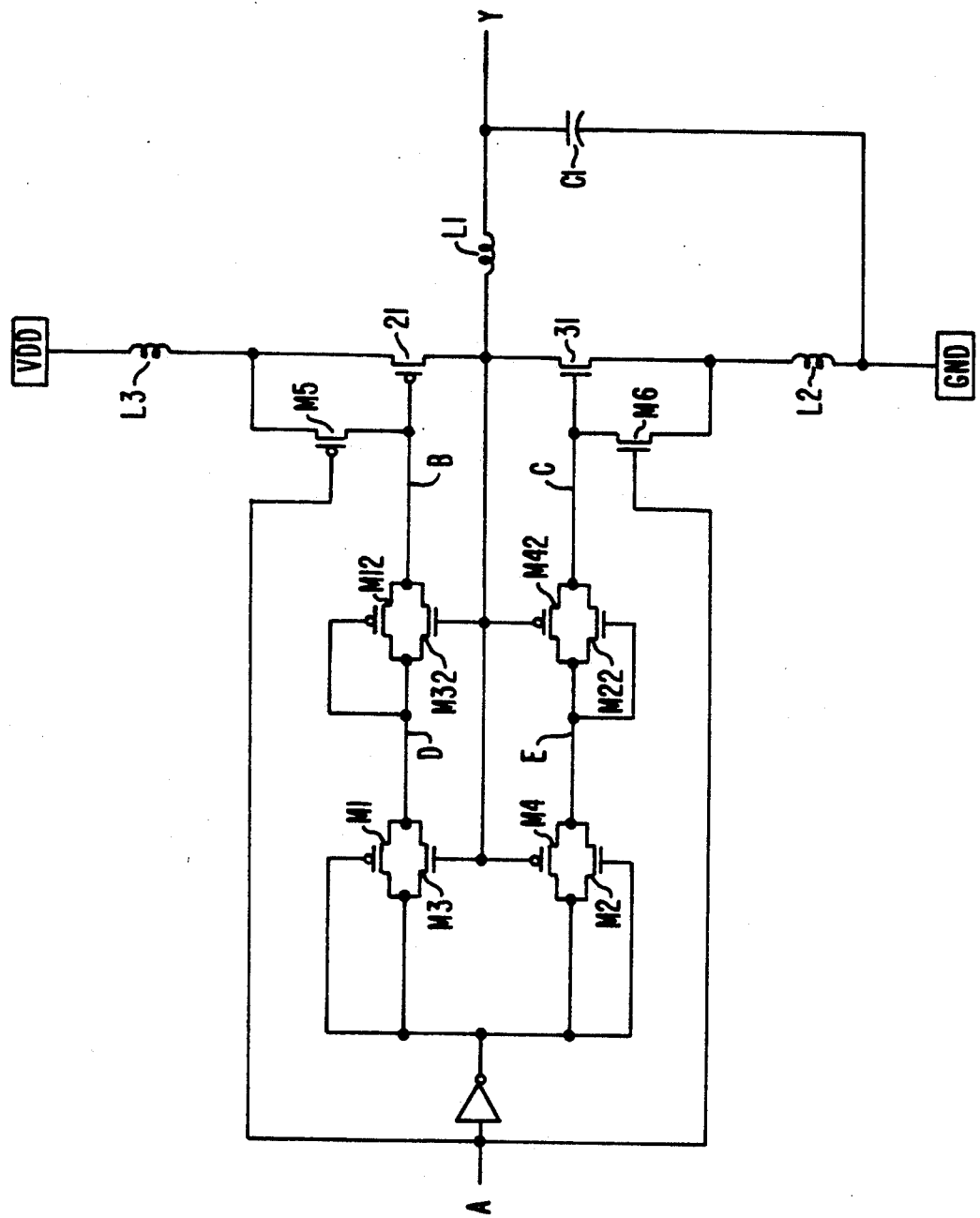
FIG. 6 shows a third preferred embodiment of the invention.

While the above description provides a full and complete description of the preferred embodiments of the present invention, various modifications, alternate constructions, and equivalents may be employed while still remaining within the scope of the invention. For example, to a person with average skill in the art, a PMOS transistor replacement of the NMOS transistor shown in our preferred embodiment together with some minor modifications of the associated circuit will still achieve the function of the invention. In addition, the present invention may be accomplished by other varied embodiments such as that shown in FIG. 6 and still be within the intended scope of protection of the present invention.

Therefore, the above description and illustrations should not be construed as limiting the scope of the invention which is defined by the following claims.

We claim:

1. An output stage with low power/ground bouncing characteristics, the output stage having a first MOS transistor and a second MOS transistor connected in cascade, the first MOS transistor having a drain terminal, a source terminal and a gate terminal, the second MOS transistor having a drain terminal, a source terminal and a gate terminal, the drain terminal of the first MOS transistor being coupled to the drain terminal of the second MOS transistor to form an output terminal, comprising:
   a first control means for turning off one of the first and second MOS transistors in response to an input signal;
   a second control means for making the other of the first and second MOS transistors ready for outputting an output signal at said output terminal in response to the input signal;
   a first gate control means for turning on said other MOS transistor partially in response to the input signal;
   a second gate control means for turning on said other MOS transistor entirely in response to the input signal and the output signal;
   whereby the ground or power bouncing is reduced when the output signal is changing state.

2. The output stage of claim 1, wherein the first MOS transistor is a PMOS transistor.

3. The output stage of claim 1, wherein the second MOS transistor is an NMOS transistor.

4. The output stage of claim 1, wherein the first control means comprises a PMOS transistor, having a gate terminal coupled to the input signal, a source terminal coupled to a power source and a drain terminal for outputing a first control signal.

5. The output stage of claim 1, wherein the second control means comprises an NMOS transistor, having a gate terminal coupled to the input signal, a source terminal coupled to a ground and a drain terminal for outputting a second control signal.

6. The output stage of claim 1, wherein the first gate control means comprises:
   a PMOS transistor, having a gate terminal and an input terminal coupled to the input signal through an inverter, and an output terminal for outputing a third control signal; and
   an NMOS transistor, having a gate terminal and an input terminal coupled to the input signal through an inverter, and an output terminal for outputing a fourth control signal.

7. The output stage of claim 1, wherein the second gate control means comprises:
   an NMOS transistor, having an input terminal coupled to the input signal through an inverter, a gate terminal couple to the output signal and an output terminal for outputing a fifth control signal; and
   a PMOS transistor, having an input terminal coupled to the input signal through an inverter, a gate terminal coupled to the output signal and an output terminal for outputing a sixth control signal.

8. The output stage of claim 6, wherein as the input signal changes state from logic 1 to logic 0, the first MOS transistor is turned off, the fourth control signal is enabled to turn on the second MOS transistor partially at a first time, and the sixth control signal is enabled to turn on the second MOS transistor entirely at a second time.

9. The output stage of claim 6, wherein as the input signal changes state from logic 0 to logic 1, the second MOS transistor is turned off, the third control signal is enabled to turn on the first MOS transistor partially at a first time, and the fifth control signal is enabled to turn on the first MOS transistor entirely at a second stage.

10. An output stage with low power/ground bouncing characteristics, the output stage having a first MOS transistor and a second MOS transistor connected in cascade, the first MOS transistor having a drain terminal, a source terminal and a gate terminal, the second MOS transistor having a drain terminal, a source terminal and a gate terminal, the drain terminal of the first MOS transistor being coupled to the drain terminal of the second MOS transistor to form an output terminal, comprising:
   a first control means for turning off one of the first and second MOS transistors in response to an input signal;
   a second control means for making the other of the first and second MOS transistors ready for outputting an output signal at said output terminal in response to the input signal;
   a first gate control means for providing a first control signal in response to the input signal;
   a second gate control means for providing a second control signal in response to the input signal and the output signal;
   a third gate control means for turning on said other MOS transistor partially in response to the first control signal;

a fourth gate control means for turning on said other MOS transistor entirely in response to the second control signal and the output signal;

whereby the ground or power bouncing phenomenon is reduced when the output signal is changing state.

11. The output stage of claim 10, wherein the first gate control means comprises:
- a PMOS transistor, having a gate terminal and an input terminal coupled to the input signal through an inverter, and an output terminal;
- an NMOS transistor, having a gate terminal and an input terminal coupled to the input signal through an inverter, and an output terminal;
- such that one of the output terminals of the PMOS and NMOS transistors outputs the first control signal in response to the input signal.

12. The output stage of claim 10, wherein the second gate control means comprises:
- an NMOS transistor, having an input terminal coupled to the input signal through an inverter, a gate terminal coupled to the output signal, and an output terminal;
- a PMOS transistor, having an input terminal coupled to the input signal through an inverter, a gate terminal coupled to the output signal, and an output terminal;
- such that one of the output terminals of the PMOS and NMOS transistors outputs the second control signal in response to the input signal and the output signal.

13. The output stage of claim 10, wherein the third gate control means comprises:
- a PMOS transistor, having a gate terminal and an input terminal coupled to the first control signal, and an output terminal;
- an NMOS transistor, having a gate terminal and an input terminal coupled to the first control signal, and an output terminal;
- such that one of the output terminals of the PMOS and NMOS transistors outputs a third control signal to the gate terminal of said other one MOS transistor in response to the first control signal.

14. The output stage of claim 10, wherein the fourth gate control means comprises:
- an NMOS transistor, having an input terminal coupled to the second control signal, a gate terminal couple to the output signal, and an output terminal;
- a PMOS transistor, having an input terminal coupled to the second control signal, a gate terminal coupled to the output signal, and an output terminal;
- such that one of the terminals of the PMOS and NMOS transistors outputs a fourth control signal to the gate terminal of said other one MOS transistor in response to the second control signal and the output signal.

* * * * *